United States Patent [19]

Huang

[11] Patent Number: 5,477,545
[45] Date of Patent: Dec. 19, 1995

[54] METHOD AND APPARATUS FOR TESTING OF CORE-CELL BASED INTEGRATED CIRCUITS

[75] Inventor: Jen-Hsun Huang, San Jose, Calif.

[73] Assignee: LSI Logic Corporation, Milpitas, Calif.

[21] Appl. No.: 16,164

[22] Filed: Feb. 9, 1993

[51] Int. Cl.⁶ ......................... G01R 31/28; G06F 11/267
[52] U.S. Cl. ...................... 371/22.3; 371/22.1; 324/158.1
[58] Field of Search ................................ 371/22.1, 22.2, 371/22.3, 22.4, 22.5, 22.6, 29.1, 25.1; 324/73.1, 158 R

[56] References Cited

U.S. PATENT DOCUMENTS

| | | | |
|---|---|---|---|
| 4,553,236 | 11/1985 | Zasio et al. | 371/22.3 |
| 4,578,773 | 3/1986 | Desai et al. | 324/29.1 |
| 4,720,672 | 1/1988 | Turino | 371/27 |
| 4,829,520 | 5/1989 | Toth | 371/29.1 |
| 4,872,169 | 10/1989 | Whetsel, Jr. | 371/22.3 |
| 4,875,003 | 10/1989 | Burke | 371/25.1 |
| 4,945,536 | 7/1990 | Hancu | 371/22.1 |
| 5,056,094 | 10/1991 | Whetsel | 371/22.1 |
| 5,103,450 | 4/1992 | Whetsel | 371/22.1 |
| 5,109,190 | 4/1992 | Sakashita et al. | 371/22.3 |
| 5,134,638 | 7/1992 | Stephens et al. | 371/22.1 |
| 5,150,044 | 9/1992 | Hashizume et al. | 371/22.3 |
| 5,175,494 | 12/1992 | Yoshimori | 371/22.3 |
| 5,260,947 | 11/1993 | Posse | 371/22.3 |

OTHER PUBLICATIONS

"You Can Obtain Boundary Scan's Benefits Despite Use of Some Nonscan ICS"; Jon Turino, Nov. 12, 1992, EDN pp. 171–174.
"IEEE Standard Test Access Port and Boundary–Scan Architecture", IEEE Std. 1149.1–1190, May 1990.

Primary Examiner—Emanuel T. Voeltz
Assistant Examiner—Eric W. Stamber
Attorney, Agent, or Firm—Carr, DeFilippo & Ferrell

[57] ABSTRACT

A technique for providing testable core-cell based integrated circuits is described whereby a boundary-scan like technique is employed, but not limited to the external pins (bond pads) of an integrated circuit. An interior boundary-scan path is provided for all peripheral signals of core cells and logic blocks which are not connected to pins of the integrated circuit. This technique provides complete controllability and observability of each core cell and/or logic block on an integrated circuit die, while remaining compatible with test techniques designed into the core cells, and remaining fully compatible with external boundary scan techniques. Method and apparatus are described.

4 Claims, 6 Drawing Sheets

METHOD AND APPARATUS FOR TESTING OF CORE-CELL BASED INTEGRATED CIRCUITS

TECHNICAL FIELD OF THE INVENTION

The invention relates to the testing of integrated circuit devices, and more particularly to the testing of custom and semi-custom integrated circuits which incorporate pre-defined core cells.

BACKGROUND OF THE INVENTION

Modern electronics systems have increased dramatically in density at virtually all levels. Integrated circuits have gone from densities of a few hundred transistors (or less) in the 1960's to densities of many millions of transistors in today's more complex microprocessors. Integrated circuit packaging density has gone from the relatively low density DIP packages (typically providing 8–40 pins on relatively large packages having a pin spacing of 0.1 inch) to today's fine-pitch technology (FPT), tape-automated bonding (TAB), and multi-chip modules (MCM's), providing hundreds of pins on relatively small packages. Conductive trace spacing and trace width on printed circuit boards (PCB's) has decreased dramatically, permitting large numbers of signals to be routed in a small space. Multi-layer PCB's and single and double-sided surface-mount techniques combine with high levels of integration and high-density integrated circuit packaging techniques to provide enormously dense electronic systems.

As electronics systems have "shrunk", they have become increasingly difficult to test. Traditional test methods include testing circuit board assemblies with so-called "bed-of-nails" testers which provide large numbers of spring-loaded contact pins which make contact with points on a printed circuit board (e.g., the pins of critical integrated circuits) to permit test access thereto. Modern fine-pitch packages, multi-layer PCB's, and double-sided surface mounting techniques frustrate attempts to test high-density electronic systems with bed-of-nails type testers.

Techniques which were once suitable for testing simpler integrated circuits with a few hundred gates are proving to be woefully inadequate with today's million-gate integrated circuits. Even user-defined semi-custom integrated circuits (ASIC's or Application Specific Integrated Circuits) routinely achieve densities of up to 100,000 gates, making them extremely difficult to test.

ASICs present a particularly difficult testing challenge. Such integrated circuits are often designed by combining pre-defined standard-cell functional blocks (often called "Core Cells") from a variety of sources with discrete logic to perform some desired function or group of functions. Even if standard test vectors or test strategies are provided with the individual standard cells (often standard cells come with no test data whatsoever) their internal connections to one another on the ASIC are often inaccessible at pins of the ASIC, dramatically complicating the test scenario.

One technique which is commonly used to gain access to standard cells on an ASIC is known as "MUX isolation" whereby a test mode or test signal is provided so that certain pins of the ASIC change function in the test mode. Multiplexers are used in the test mode to connect the ordinarily inaccessible signals of the standard cell(s) to pin of the ASIC. When the test signal (or mode) is removed, the pins revert to their normal functions. The MUX isolation technique is sometimes impractical or impossible, for example, when there are more signals at the periphery of a standard cell than there are pins on the ASIC containing it.

Another technique used for testing of ASICs is a "full-scan" design, whereby every flip-flop of a logic circuit has a multiplexer placed at its input so that in the presence of a test signal, all of the flip-flops are strung together into a shift register. This shift register is then used to clock in test patterns (stimuli) and to clock out test results (responses).

The full-scan test architecture assumes a fully-synchronous design, and is less beneficial for designs which include asynchronous logic, or which are not clocked by a common clock. Further, if a standard cell is not originally designed for full-scan testing, then modifying it to adapt it to full-scan testing can seriously alter its internal timing, possibly causing it to fail, or to slow unacceptably. Another problem with full-scan testing is that it only provides access to internal nodes and does not provide observability of the signals at the periphery of the standard cell, which may be several levels of logic removed from the flip-flops of the standard cell.

The "key" issues in testing a complex system (whether a circuit board, a standard integrated circuit, or an ASIC) are "controllability" and "observability" of critical elements in the system. "Controllability" is the ability to cause specific patterns of signals (stimulus) to be applied to the critical elements. "Observability" is the ability to determine that the critical elements have responded appropriately (response) to those patterns of signals.

Elaborate techniques such as reachability analysis have been developed to determine whether or not a particular element in the interior of a circuit design can be exercised ("reached") from the external interface to the circuit, and how (if possible) the operation of that particular element may be monitored. If a reachability analysis shows that a particular circuit element is not reachable (not controllable) or cannot be monitored (not observable) then the circuit design may be altered to provide test access to that element. This technique, however, is highly interactive (with the designer) and labor-intensive, and does not necessarily provide optimal or even near optimal test architectures.

An approach which addresses the access problem in testing complex printed circuit boards is known as "Boundary Scan" or JTAG type testing. The test architecture which defines one such boundary scan test technique is given in IEEE Standard No. 1149.1 Test Access Port (TAP) specification. Boundary-scan techniques, such as that described in the IEEE Standard, permit access to nodes (signals) of an electronic assembly by electrical rather than physical means. According to the IEEE TAP specification, four pins are added to each boundary-scan equipped integrated circuit (IC): a serial Test Data Input (TDI) signal, a serial Test Data Output (TDO) signal, a Test Mode Select (TMS) signal, and a Test Clock (TCK) signal. These pins control the operation of a Test Access Port (TAP) comprising a (relatively) small amount of on-chip circuitry added to the normal logic of each such integrated circuit. Portions of the TAP circuitry known as boundary-scan "cells" are interposed between the input/output signals of the logic of the integrated circuit and their respective input/output pins. The TAP includes one boundary-scan "cell" for each of the functional input/output pins of the integrated circuit and a TAP controller. The boundary-scan cells are arranged in a serially-connected shift-register chain by which test data may be shifted into and out of the integrated circuit. The TAP controller is essentially a finite-state machine which controls and configures all test operations performed via the boundary scan cells.

The four test pins, TDI, TDO, TMS, and TCK, connect to the on-chip TAP. The TMS and TCK operate together to clock chip-state data into the TAP controller, which in turn tells the TAP what mode of operation to assume. Depending upon the state (mode) of the TAP, data on the TDI line can go to pin-data registers in the boundary-scan cells, to bypass registers associated with the boundary scan cells or to any other registers accessible to the TAP. The bypass registers are provided to permit individual boundary scan cells to be bypassed and "removed" from the serially connected shift-register chain of boundary-scan cells (until reinstated by changing the contents of the bypass register). The data registers are used to "force" test data onto input signals of the functional logic of the integrated circuit. Among the modes assumable by the TAP is a test isolation mode whereby the input (and output) pins of the integrated circuit may be logically "disconnected" from the input (and output) signals of the logic of the integrated circuit, logically replacing the "broken" connections with connections to the data registers of the boundary scan cells. After operating the integrated circuit with the "forced" test data in the boundary-scan cells, output signals may then be sampled into their associated boundary-scan cells (using another mode of the TAP) and shifted out of the integrated circuit on the TDO pin for external analysis.

FIG. 1 is a block diagram of a prior-art integrated circuit 100 which employs a boundary-scan test architecture according to IEEE Standard 1149.1. An integrated circuit package 110 is shown having six input signal pins 120a, 120b, 120c, 120d, 120e, and 120f, six output signal pins 125a, 125b, 125c, 125d, 125e, and 125f, and four test interface pins 170 (TDI, or "Test Data In"), 175 (TDO, or "Test Data Out"), 180 (TMS, or "Test Mode Select"), and 185 (TCK, or "Test Clock"). Functional logic 150 on an integrated circuit die within the package 110 has six input signals 140a, 140b, 140c, 104d, 140e, and 140f, and six output signals 145a, 145b, 145c, 145d, 145e, and 145f. Each of the input and output signals is connected to a pin of the package 110 via a boundary scan cell. Input signal 140a is connected to input pin 120a via a boundary scan cell 130a. Input signal 140b is connected to input pin 120b via a boundary scan cell 130b. Input signal 140c is connected to input pin 120c via a boundary scan cell 130c. Input signal 140d is connected to input pin 120d via a boundary scan cell 130d. Input signal 140e is connected to input pin 120e via a boundary scan cell 130e. Input signal 140f is connected to input pin 120f via a boundary scan cell 130f. Output signal 145a is connected to output pin 125a via a boundary scan cell 135a. Output signal 145b is connected to output pin 125b via a boundary scan cell 135b. Output signal 145c is connected to output pin 125c via a boundary scan cell 135c. Output signal 145d is connected to output pin 125d via a boundary scan cell 135d. Output signal 145e is connected to output pin 125e via a boundary scan cell 135e. Output signal 145f is connected to output pin 125f via a boundary scan cell 135f.

A Test Access Port (TAP) 165 comprising the twelve boundary-scan cells 130a–130e, 135a–135e, and a Test Access Port controller 160 is connected to the four test pins TDI, TDO, TMS, and TCK, (170, 175, 180, and 185, respectively). The Test Access Port controller logic 160 controls the operational state (mode) of the TAP 165 according to logic signals received via the test pins. The TAP controller 160 is essentially a finite state machine integrated on the integrated circuit die with the functional logic 150 for the purpose of controlling test-related operation of the integrated circuit 100. The four test interface pins 170, 175, 180, and 185 are completely separate from the "normal" functional pins (i.e., 120a–120f and 125a–125f) of the integrated circuit 100 and provide a completely isolated test interface which does not interfere in any way with the normal operation of the integrated circuit.

The boundary scan cells 130a–130f and 135a–135f are arranged into a serially-connected shift-register chain beginning at the TDI (Test Data Input) pin 170, and ending at the TDO (Test Data Out) pin 175 in the following order: 130a, 130b, 130c, 103d, 130e, 130f, 135f, 135e, 135d, 135c, 135b, 135a. The boundary scan cells (130a–130f, 135a–135f) permit the input and output signals (140a–140f and 145a–145f, respectively) to be isolated from their respective input and output pins (120a–120f and 125a–125f, respectively), and provide for test data patterns to be shifted into the serially connected chain via the TDI and TCK test pins (170 and 185, respectively) and applied to the input signals (140a–140f) of the functional logic 150. After the test data is shifted in and applied to the input signals 140a–140f, the functional logic is exercised and resulting data patterns on output signals (145a–145f) are sampled into their respective boundary-scan cells (135a–135f) and shifted out of the chain via the TDO pin. Preferably, boundary-scan cells associated with output signals (e.g., cell 135a associated with output signal 145a) are located towards the end of the serially connected chain so that test result signals are closer to the TDO pin and are accessible with the smallest number of shift clocks possible.

FIG. 2 is a circuit diagram of a small electronic system 200 comprising two boundary-scan equipped integrated circuits 210a and 210b each comprising Functional Logic and a dozen boundary scan cells like circuit 110, and logic circuitry 220 comprising a D-type flip-flop 222 and two logic NAND gates 224 and 226. A boundary-scan test strategy is applied to the system 200. The data input (D) of flip-flop 222 is connected by a line 230 to an output signal of the integrated circuit 210a. The clock input (>) of the flip-flop 222 is connected by a line 232 to another output of the integrated circuit 210a. The two NAND gates 224 and 226 are connected and configured as an R-S latch. One input of this R-S latch is connected via a line 234 to an output of the integrated circuit 210a. The other input of this R-S latch is connected via a line 244 to an output of the integrated circuit 210b. One output of the R-S latch is connected to a line 242 input terminal of the integrated circuit 210b, and the other output of the R-S latch is connected to a line 236 input terminal of the integrated circuit 210a.

Four test pins are provided on each of the two integrated circuits. The integrated circuit 210a has a TDI pin 270a, a TDO pin 275a, a TMS pin 280a, and a TCK pin 285a. The integrated circuit 210b has a TDI pin 270b, a TDO pin 275b, a TMS pin 280b, and a TCK pin 285b. The TDO pin 275a of the integrated circuit 210a is connected via a line 260 to the TDI pin 270b of the integrated circuit 210b, thus creating a long serial boundary-scan chain beginning at a serial data input line 294 connected to the TDI pin 270a of the integrated circuit 210a and ending at a serial data output line 296 connected to the TDO pin 275b of the integrated circuit 210b. The TMS pins 280a and 280b of the two integrated circuits 210a and 210b, respectively, are connected together in parallel via a line 290. The two TCK pins 285a and 285b of the two integrated circuits 210a and 210b are connected together in parallel via a line 292.

Testing of the system is accomplished by using the TMS and TCK signals to place the two integrated circuits 210a and 210b into a test mode, then clocking configuration and test data into the boundary-scan serial chain via the serial data input line 294. The integrated circuits 210a and 210b are then placed into an execution mode whereby they may be exercised with the test data. The integrated circuits are then placed into another mode whereby output signals of the integrated circuits 210a and 210b are sampled into the boundary-scan serial chain, and shifted out on the serial data output line 296. Both chips are tested in parallel.

Assuming that it is possible to use the boundary-scan chain to force output signals to the pins of the integrated circuits 210a and 210b (IEEE std. no 1149.1 provides a definition of a boundary-scan technique capable of this) the logic circuitry 220 located between the two chips may be similarly tested in a separate test operation.

Although the IEEE standard boundary-scan technique (or any boundary-scan technique, for that matter) may be applied to an ASIC, it does not solve the inherent problems in testing ASICs. Boundary-scan only provides access to the periphery of an integrated circuit, not to the internal nodes thereof, and is primarily intended to isolate the integrated circuit from other circuitry in a larger system. However the problem of testing the ASIC itself is not addressed by boundary-scan techniques.

Full-scan design may be applied to an ASIC, which does provide for good controllability and observability, but some standard cells are not initially designed with full-scan testing capability. Modification of the designs of the standard cells can be time consuming. Determining a suitable set of test vectors for such a modified design can be even more complicated and time consuming. There is no simple technique for translating a set of test vectors for a standard cell into test vectors for the standard cell after re-design for full-scan capability. In fact, the original test vectors may be completely useless for the purposes of full-scan testing.

Compounding the problem of testing ASICs is that different standard cells incorporated into a single ASIC may be equipped with incompatible test strategies. For example, a single ASIC may incorporate one standard cell design with full-scan test capability, another with CBIST (another test structure) test capability, and another with no particular test strategy at all. Test vectors might be provided by the supplier of the standard cell designs for each of the standard cells, but the application of these test vectors assumes that each and every one of the "pins" or external signals of the associated standard cell is independently accessible. Internal connections and "hidden" connections (connections between the standard cells and with other logic) within the ASIC prevent ready access to these signals. While MUX isolation may be used in some cases to provide test access to these signals, it may be impractical or impossible to provide access to all of the signals of all of the standard cells at once. Assuming, then, that the standard cells can be made accessible at the pins of the ASIC only one at a time, it is necessary to test the standard cells one at a time, rather than in a more desirable parallel fashion.

While these techniques, at best, provide for adequate testing of standard cells in an ASIC, they do nothing to test any discrete user logic between the standard cells. As a result, it may be necessary to design specialized test circuitry around the user logic to permit it to be tested.

DISCLOSURE OF THE INVENTION

It is therefore an object of the present invention to provide an improved technique for testing standard-cell based ASICs.

It is a further object of the present invention to provide a technique for testing standard-cell based ASICs which permits use of pre-defined test vectors for the ASICs.

It is a further object of the present invention to provide a technique for testing standard-cell based ASICs which is capable of merging otherwise incompatible test techniques.

It is a further object of the present invention to provide a technique for testing standard-cell based ASICs which is compatible with boundary-scan IC test architectures.

It is a further object of the present invention to provide a technique for testing standard-cell based ASICs which permits isolation and test of user logic on the ASIC.

It is a further object of the present invention to provide a technique for testing standard-cell based ASICs which permits concurrent testing of all of the standard cells in an ASIC.

According to the invention, a testable core-cell based integrated circuit is provided, comprising two or more logic blocks on an integrated circuit die, each logic block having input and output signals, and "pins" (external connection points to the die), a plurality of boundary-scan cells, a first boundary-scan cell for each input signal of each logic block connected to the input signal by its data output, and a second boundary-scan cell for each output signal of each logic block connected to the output signal by its data input. Connections are formed between selected data inputs of at least a portion of the first boundary-scan cells (i.e., the "the peripheral-scan" cells) and selected data outputs of at least a portion of the second boundary-scan cells (i.e., the "peripheral-scan" cells), said connections remaining interior to the die and not connecting to any "pins" of the die. Other connections are formed between a remaining portion of the data inputs of the first boundary-scan cells and respective "pins" of the die and between a remaining portion of the data outputs of the second boundary-scan cells and respective "pins" of the die. The boundary-scan cells are arranged into one or more serially connected chains such that the shift data output of any boundary-scan cell in a serially connected chain is connected to the shift data input of a subsequent boundary-scan cell in the serially connected chain, with the shift data input of a first boundary-scan cell in each serially connected chain being connected to a serial data input "pin" of the die, and the shift data output of a final boundary-scan cell in each serially connected chain being connected to a serial data output "pin" of the die.

In one embodiment of the invention, all of the boundary scan cells with connections formed to "pins" of the die are arranged into a first serially connected chain, and all of the boundary scan cells without connections formed to "pins" of the die, i.e., peripheral scan cells, are arranged into a second serially connected chain.

In another embodiment of the invention, all of the first and second boundary-scan cells are arranged into a single serially connected chain.

In still another embodiment of the invention, the first and second boundary-scan cells are arranged into more than two separate serially connected chains.

According to a feature of the invention, the first and second boundary-scan cells may be separated into distinct serially connected chains.

According to another feature of the invention, the serially connected chains may be organized such that in a serially connected chain having both first boundary-scan cells and second boundary-scan cells, the second boundary-scan cells are arranged such that they occur after the first boundary-scan cells in the serially connected chain.

Another feature of the invention provides that each first boundary-scan cell further comprises means for shifting an input data value into said first boundary-scan cell along the serially connected chain to which the first boundary-scan cell belongs and means for logically connecting the data output thereof to either the data input thereof or to the input data value therein.

Still another feature of the invention provides that each second boundary-scan cell further comprises means for sampling the data input signal and storing an output data value associated therewith in said second boundary-cell and means for shifting said output data value along the serially connected chain to which the second boundary-scan cell belongs.

Other aspects of the present invention provide for boundary scan cells which may be "bypassed", or logically removed from the serially connected chains to which they belong.

Another embodiment of the invention is a method of testing core-cell based integrated circuits, comprising the steps of:

providing an integrated circuit of the type described hereinabove;

isolating each logic block from the connections thereto;

shifting test data input values into each serially connected chain of boundary-scan cells;

operating each logic block for a predetermined time interval with the test data values applied to the inputs thereof via the first boundary-scan cells;

sampling the output signal values into the second boundary-scan cells; and shifting the sampled output signal values out of each serially connected chain of boundary-scan cells as binary boundary-scan response "words".

One aspect of the inventive test method further comprises providing a set of test vectors for each logic block, each set of test vectors including a set of stimulus vectors, stimulus durations, and a set of expected response vectors, each stimulus vector comprising a series of data input values to be applied to specific input signals of the logic block, and each response vector comprising a set of expected output signal values for each logic block, providing a binary boundary-scan input "word" data format, said data format comprising a plurality of bit positions, with a specific bit position representing each logic block input signal, associating data input values in each stimulus vector with an associated bit position in the binary boundary-scan input "word" data format, translating each stimulus vector into a corresponding boundary-scan input "word" according to the binary boundary-scan input word data format and bit position associations between the stimulus vectors and the binary boundary-scan input "word" format, and providing the translated boundary-scan input "words" as test data input values.

Another aspect of the inventive test method further comprises providing a binary boundary-scan response "word" data format, said data format comprising a plurality of bit positions, with a specific bit position representing each logic block output signal, associating expected output signal values in each response vector with an associated bit position in the binary boundary-scan response "word" data format, translating each response vector into a corresponding boundary-scan expected response "word" according to the binary boundary-scan response "word" data format and bit position associations between the response vectors and the binary boundary-scan response "word" format, and providing the translated boundary-scan input "words" for comparison with actual boundary-scan response word values.

Another aspect of the inventive method provides data input values concurrently to all logic blocks on the integrated circuit die, and operates all logic blocks simultaneously.

Another aspect of the inventive method provides for bypassing selected boundary-scan cells during testing.

Other objects, features and advantages of the invention will become apparent in light of the following description thereof.

DETAILED DESCRIPTION OF THE INVENTION

The present invention permits complete controllability and observability of the standard cells and user logic of·an ASIC by providing boundary-scan-like "peripheral-scan" cells around the entire periphery of each standard cell and around the user logic, even where the standard cells and user logic are not connected to pins of the ASIC. If the ASIC is equipped with boundary-scan capability at its pins (or, perhaps more appropriately, its bond pads), then it is only necessary to add "peripheral-scan" cells to those peripheral signals of the standard cells and user logic which are not connected to pins of the ASIC.

These "extra" boundary-scan ("peripheral-scan") cells for "hidden" signals of standard cells and user logic may be viewed as an "interior" boundary-scan chain (or interior peripheral scan chain), which may be provided as an extension of the "standard" boundary-scan chain around the pins of the ASIC or may be provided as an isolated, supplementary chain. In either case, the standard cells may be isolated from one another and concurrently and independently exercised and observed.

Figure 1:
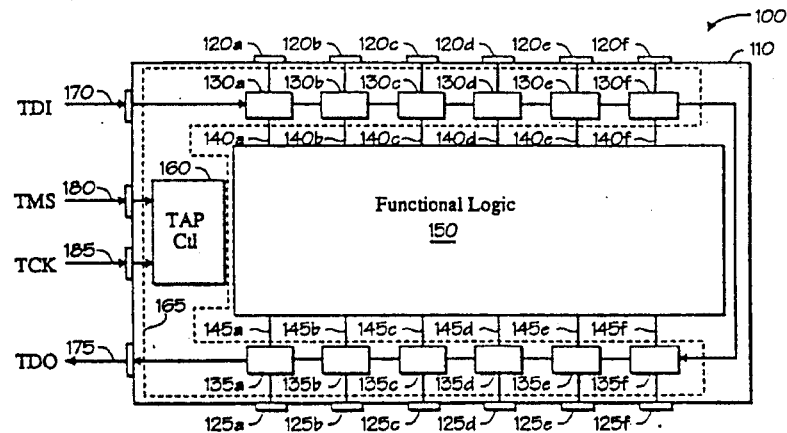
FIG. 1 is a block diagram of a representative integrated circuit chip employing a boundary scan test architecture, of the prior art.
Figure 2:
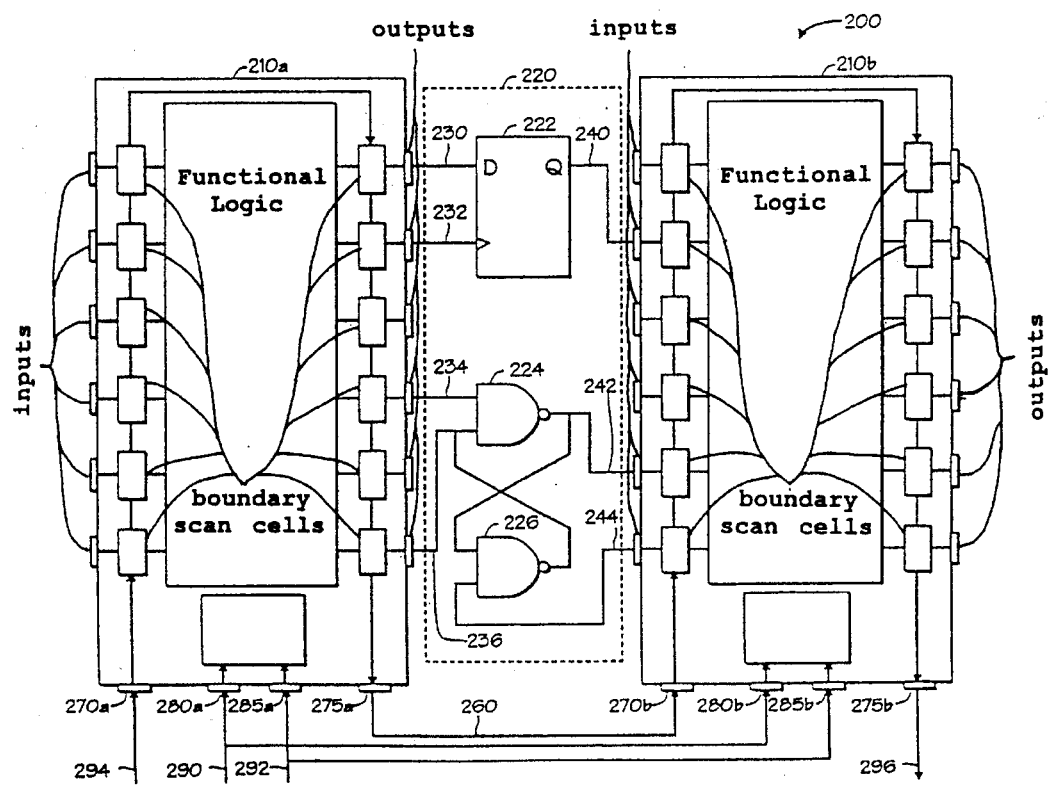
FIG. 2 is a circuit diagram showing the use of the boundary scan test architecture in a simple system of two integrated circuits and discrete logic.
Figure 3A:
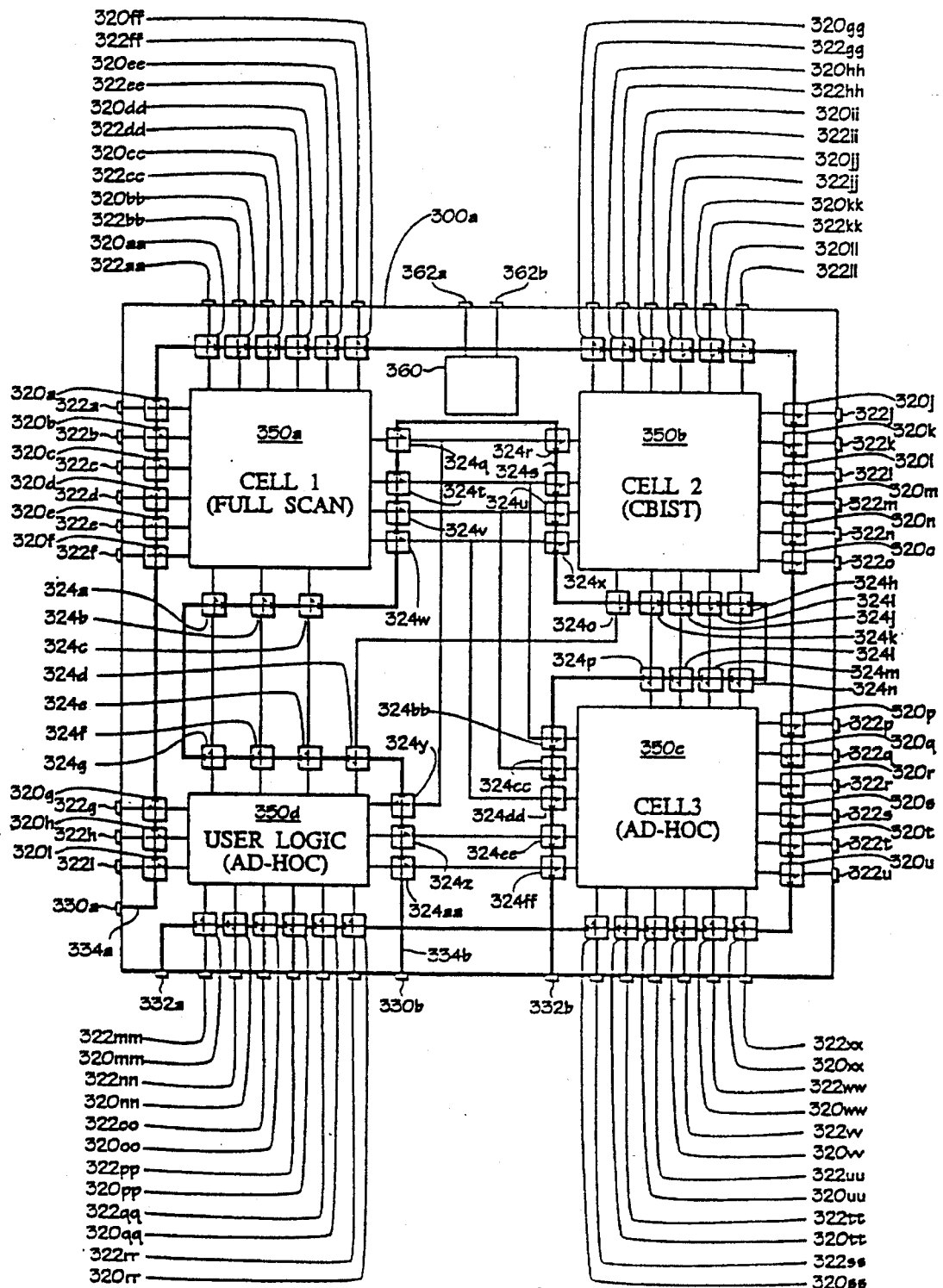
FIGS. 3a–3c are block diagrams of an integrated circuit die (ASIC) employing an interior peripheral scan test architecture, according to the present invention.

FIG. 3a shows a boundary-scan equipped ASIC 300a which has an additional interior scan chain. The ASIC 300a has four blocks of logic 350a, 350b, 350c, and 350d. A first of these logic blocks 350a is a standard cell incorporating a full-scan design strategy, and for which complete test vectors and responses have been provided by the supplier thereof. A second of these logic blocks 350b is a standard cell incorporating a CBIST test strategy, and for which complete test vectors and responses have been provided by the supplier thereof. A third of these logic blocks 350c is another standard cell which does not incorporate any formal test design strategy, but for which complete test vectors and responses have been provided by the supplier thereof. The fourth of these logic blocks 350d is a user-designed block of discrete logic which incorporates no particular formal test strategy, but which has been analyzed and simulated by the user/designer thereof to provide suitable test vectors and responses therefor.

Each of the logic blocks (350a,b,c, and d) has a plurality of peripheral signals (external signals), each of which is connected to a boundary scan cell 320'x' interposed between it and a respective pin 322'x' of the ASIC 300a.

Figure 3B:
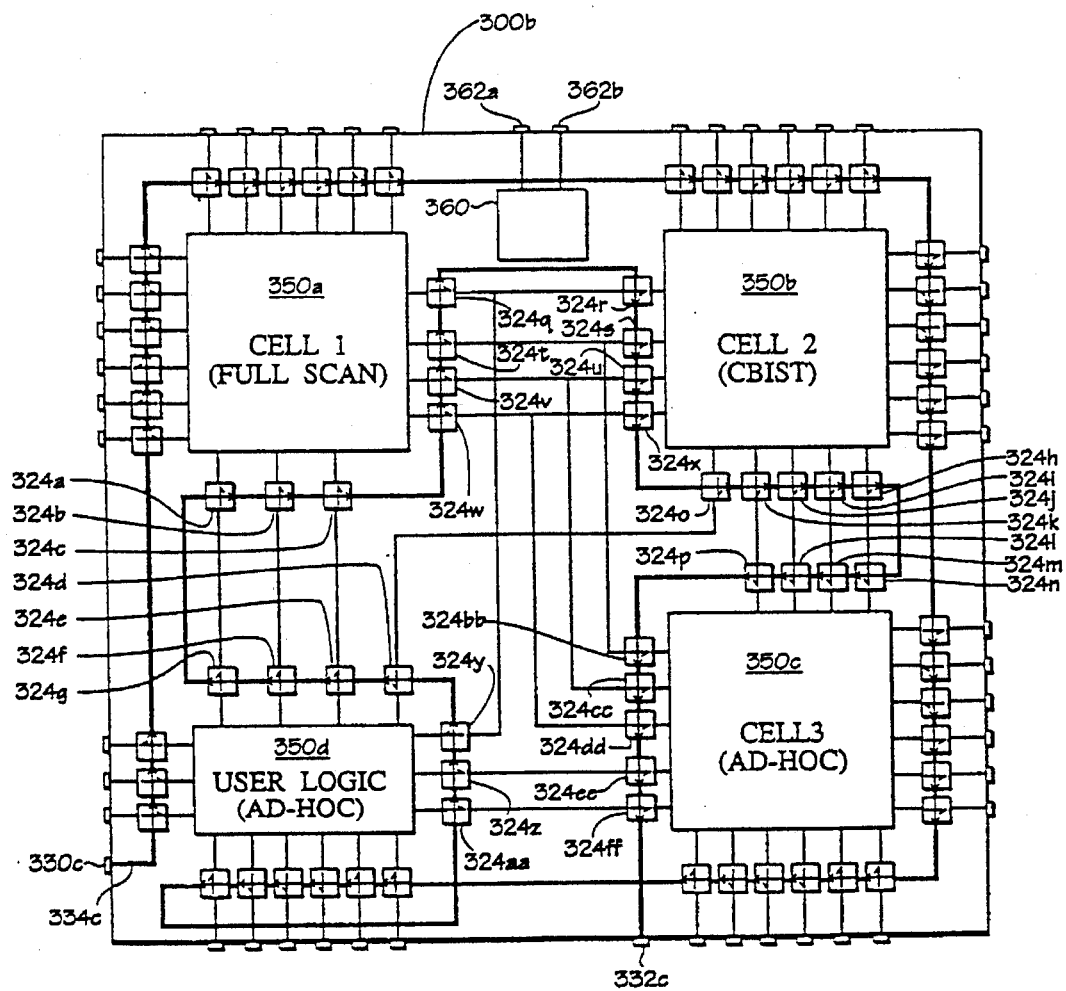
Figure 3C:
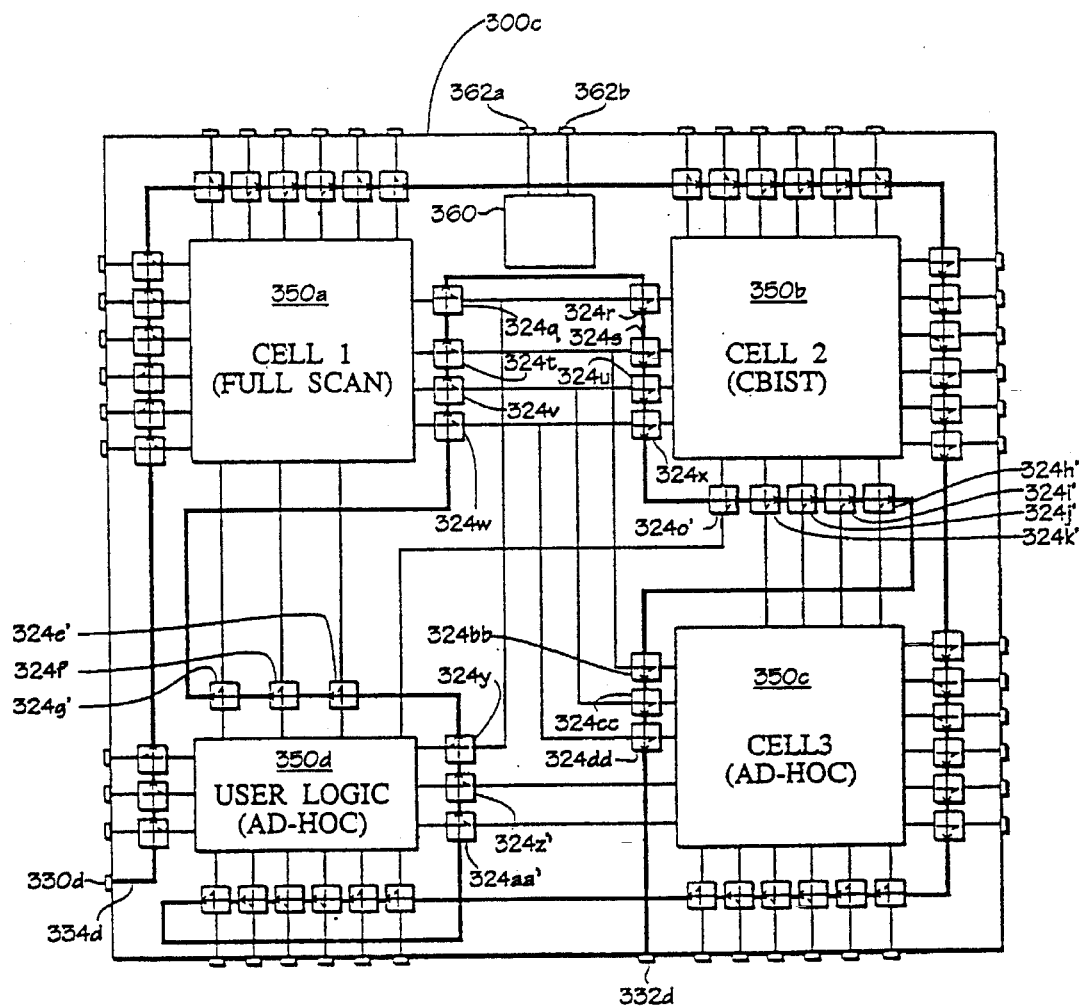
Figure 4A:
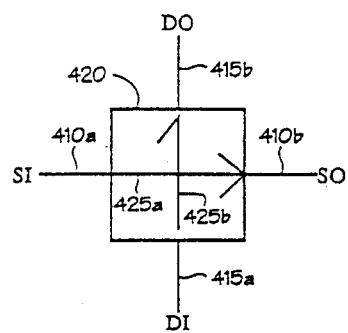
FIG. 4a is a block diagram representation of a typical peripheral scan cell, according to the invention.

Skipping briefly to FIG. 4a, each of the boundary scan cells 320'x' in FIGS. 3a–c is represented by a graphic symbol similar to the graphic symbol 420 shown in FIG. 4a. This symbol 420 represents a boundary scan cell, and arrows (e.g., 425a, 425b) on the symbol 420 indicate the direction of data flow to or from a pin or signal of a logic block, and the direction of data flow within the boundary-scan chain. Each boundary scan cell (and graphic representation thereof) has connections to a data input (DI) (e.g., 415a), a data output (DO) (e.g., 415b) a serial scan data input (SI) (e.g., 410a), and a serial-scan data output (SO) (e.g., 410b). An arrow 425a on each boundary-scan cell graphical symbol 420, extending completely across the graphical symbol 420 and having an arrow-head formed of two line segments represents the direction of data flow from serial in (SI) to serial out (SO). Another arrow 425b having an arrow-head formed from a single line segment, and arranged perpendicular to the direction of the first arrow 425a, indicates the direction of data flow from data input (DI) to data output (DO).

Returning to FIG. 3a, a test access port (TAP) controller 360 is provided on the ASIC 300a. A test mode select (TMS) signal connects to the TAP controller 360 via a pin 362a on the ASIC 300a. A test clock (TCK) signal connects to the TAP controller 360 via a pin 362b on the ASIC 300a. Other pins of the ASIC 300a are connected as follows:

A pin 322a of the ASIC 300a connects to an input signal of the standard cell 350a via a boundary-scan cell 320a. A pin 322b of the ASIC 300a connects to an input signal of the standard cell 350a via a boundary-scan cell 320b. A pin 322c of the ASIC 300a connects to an input signal of the standard cell 350a via a boundary-scan cell 320c. A pin 322d of the ASIC 300a connects to an output signal of the standard cell 350a via a boundary-scan cell 320d. A pin 322e of the ASIC 300a connects to an output signal of the standard cell 350a via a boundary-scan cell 320e. A pin 322f of the ASIC 300a connects to an input signal of the standard cell 350a via a boundary-scan cell 320f. A pin 322g of the ASIC 300a connects to an output signal of the user logic 350d via a boundary-scan cell 320g. A pin 322h of the ASIC 300a connects to an input signal of the user logic 350d via a boundary-scan cell 320h. A pin 322i of the ASIC 300a connects to an input signal of the user logic 350d via a boundary-scan cell 320i. A pin 322j of the ASIC 300a connects to an output signal of the standard cell 350b via a boundary-scan cell 320j. A pin 322k of the ASIC 300a connects to an input signal of the standard cell 350b via a boundary-scan cell 320k. A pin 322l of the ASIC 300a connects to an input signal of the standard cell 350b via a boundary-scan cell 320l. A pin 322m of the ASIC 300a connects to an output signal of the standard cell 350b via a boundary-scan cell 320m. A pin 322n of the ASIC 300a connects to an output signal of the standard cell 350b via a boundary-scan cell 320n. A pin 322o of the ASIC 300a connects to an output signal of the standard cell 350b via a boundary-scan cell 320o. A pin 322p of the ASIC 300a connects to an output signal of the standard cell 350c via a boundary-scan cell 320p. A pin 322q of the ASIC 300a connects to an input signal of the standard cell 350c via a boundary-scan cell 320q. A pin 322r of the ASIC 300a connects to an input signal of the standard cell 350c via a boundary-scan cell 320r. A pin 322s of the ASIC 300a connects to an output signal of the standard cell 350c via a boundary-scan cell 320s. A pin 322t of the ASIC 300a connects to an output signal of the standard cell 350c via a boundary-scan cell 320t. A pin 322u of the ASIC 300a connects to an output signal of the standard cell 350c via a boundary-scan cell 320u.

A pin 322aa of the ASIC 300a connects to an output signal of the standard cell 350a via a boundary-scan cell 320aa. A pin 322bb of the ASIC 300a connects to an input signal of the standard cell 350a via a boundary-scan cell 320bb. A pin 322cc of the ASIC 300a connects to an input signal of the standard cell 350a via a boundary-scan cell 320cc. A pin 322dd of the ASIC 300a connects to an input signal of the standard cell 350a via a boundary-scan cell 320dd. A pin 322ee of the ASIC 300a connects to an output signal of the standard cell 350a via a boundary-scan cell 320ee. A pin 322ff of the ASIC 300a connects to an output signal of the standard cell 350a via a boundary-scan cell 320ff. A pin 322gg of the ASIC 300a connects to an output signal of the standard cell 350b via a boundary-scan cell 320gg. A pin 322hh of the ASIC 300a connects to an output signal of the standard cell 350b via a boundary-scan cell 320hh. A pin 322ii of the ASIC 300a connects to an input signal of the standard cell 350b via a boundary-scan cell 320ii. A pin 322jj of the ASIC 300a connects to an input signal of the standard cell 350b via a boundary-scan cell 320jj. A pin 322kk of the ASIC 300a connects to an input signal of the standard cell 350b via a boundary-scan cell 320kk. A pin 322ll of the ASIC 300a connects to an output signal of the standard cell 350b via a boundary-scan cell 320ll. A pin 322mm of the ASIC 300a connects to an input signal of the user logic 350d via a boundary-scan cell 320mm. A pin 322nn of the ASIC 300a connects to an output signal of the user logic 350d via a boundary-scan cell 320nn. A pin 322oo of the ASIC 300a connects to an output signal of the user logic 350d via a boundary-scan cell 320oo. A pin 322pp of the ASIC 300a connects to an output signal of the user logic 350d via a boundary-scan cell 320pp. A pin 322qq of the ASIC 300a connects to an input signal of the user logic 350d via a boundary-scan cell 320qq. A pin 322rr of the ASIC 300a connects to an input signal of the user logic 350d via a boundary-scan cell 320rr. A pin 322ss of the ASIC 300a connects to an input signal of the standard cell 350c via a boundary-scan cell 320ss. A pin 322tt of the ASIC 300a connects to an output signal of the standard cell 350c via a boundary-scan cell 320tt. A pin 322uu of the ASIC 300a connects to an output signal of the standard cell 350c via a boundary-scan cell 320uu. A pin 322vv of the ASIC 300a connects to an output signal of the standard cell 350c via a boundary-scan cell 320vv. A pin 322ww of the ASIC 300a connects to an input signal of the standard cell 350c via a boundary-scan cell 320ww. A pin 322xx of the ASIC 300a connects to an input signal of the standard cell 350c via a boundary-scan cell 320xx.

Internal connections between the standard cells 350a, 350b, and 350c, and the user logic 350d are as follows:

A boundary-scan cell 324g connects to an output of the user logic 350d and to another boundary-scan cell 324a, which in turn connects to an input signal of the standard cell 350a. A boundary-scan cell 324f connects to an output of the user logic 350d and to another boundary-scan cell 324b, which in turn connects to an input signal of the standard cell 350a. A boundary-scan cell 324e connects to an output of the user logic 350d and to another boundary-scan cell 324c, which in turn connects to an input signal of the standard cell 350a. A boundary-scan cell 324o connects to an output of the standard cell 350b and to another boundary-scan cell 324d, which in turn connects to an input signal of the user logic 350d. A boundary-scan cell 324h connects to an output of the standard cell 350b and to another boundary-scan cell 324n, which in turn connects to an input signal of the standard cell 350c. A boundary-scan cell 324i connects to an output of the standard cell 350b and to another boundary-scan cell 324m, which in turn connects to an input signal of the standard cell 350c. A boundary-scan cell 324j connects to an output of the standard cell 350b and to another boundary-scan cell 324l, which in turn connects to an input signal of the standard cell 350c. A boundary-scan cell 324k connects to an output of the standard cell 350b and to another boundary-scan cell 324p, which in turn connects to an input signal of the standard cell 350c. A boundary-scan cell 324z connects to an output of the user logic 350d and to another boundary-scan cell 324ee, which in turn connects to an input signal of the standard cell 350c. A boundary-scan cell 324aa connects to an output of the user logic 350d and to another boundary-scan cell 324ff, which in turn connects to an input signal of the standard cell 350c.

A boundary-scan cell 324q connects to an output of the standard cell 350a and to two other boundary-scan cells, 324r and 324y. Boundary-scan cell 324r further connects to an input signal of the standard cell 350b and boundary-scan cell 324y further connects to an input of the user logic 350d. A boundary-scan cell 324t connects to an output of the standard cell 350a and to two other boundary-scan cells, 324s and 324bb. Boundary-scan cell 324s further connects to an input signal of the standard cell 350b and boundary-scan cell 324bb further connects to an input of the standard cell 350c. A boundary-scan cell 324v connects to an output of the standard cell 350a and to two other boundary-scan cells, 324u and 324cc. Boundary-scan cell 324u further connects to an input signal of the standard cell 350b and boundary-scan cell 324cc further connects to an input of the standard cell 350c. A boundary-scan cell 324w connects to an output of the standard cell 350a and to two other boundary-scan cells, 324x and 324dd. Boundary-scan cell 324x further connects to an input signal of the standard cell 350b and boundary-scan cell 324dd further connects to an input of the standard cell 350c.

Two separate serial scan chains are provided on the ASIC. A "standard" boundary scan chain starts at a serial data in pin 330a and follows the path shown as 334a through boundary-scan cells 322i, 322h, 322g, 322f, 322e, 322d, 322c, 322a, 322aa, 322bb, 322cc, 322dd, 322ee, 322ff, 322gg, 322hh, 322ii, 322jj, 322kk, 322ll, 322j, 322k, 322l, 322m, 322n, 322o, 322p, 322q, 322r, 322s, 322t, 322t, 322xx, 322ww, 322vv, 322uu, 322tt, 322ss, 322rr, 322qq, 322pp, 322oo, 322nn, and 322mm, in that order, ending at a serial data out pin 332a. An "interior" boundary scan chain starts at a serial data in pin 330b and follows the path shown as 334b through boundary-scan cells 324aa, 324z, 324y, 324d, 324e, 324f, 324g, 324a, 324b, 324c, 324w, 324v, 324t, 324q, 324r, 324s, 324u, 324x, 324o, 324k, 324j, 324i, 324h, 324n, 324m, 324l, 324k, 324p, 324bb, 324cc, 324dd, 324ee, and 324ff, in that order, ending at a serial data out pin 332b.

The ASIC 300a of FIG. 3a illustrates a test strategy of providing a "standard" boundary scan test architecture and supplementing it with an interior scan chain. The interior scan chain accesses and isolates those peripheral signals of the standard cells and user logic which are not connected to pins of the ASIC. This technique eliminates the need for such techniques as MUX isolation, and is compatible with any test strategy already employed in the standard cells.

FIG. 3b is a block diagram of an ASIC 300b employing an "interior" peripheral scan test architecture according to the present invention. ASIC 300b is identical in function to the ASIC 300a described hereinabove with respect to FIG. 3a, except that the separate scan chains of FIG. 3a are concatenated into a single scan chain in FIG. 3b. The combined scan chain starts at a serial data in pin 330c of the ASIC 300b and proceeds along the serial scan path 334c, encountering all of the boundary-scan cells in a single chain, and ending at a serial data out pin 332c of the ASIC 300b.

FIG. 3c is a block diagram of another ASIC 300c, identical to the ASIC 300b except that a simplified scan architecture is used. In FIG. 3c, the interior boundary-scan cells 324a, 324b, 324c, 324p, 324l, 324m, 324n, 324ee, and 324ff are eliminated. Modified interior boundary-scan cells 324e', 324f', 324g', 324aa', 324z', 324h', 324i', 324j', 324k' and 324o' replace interior boundary-scan cells 324e, 324f, 324g, 324aa, 324z, 324h, 324i, 324j, and 324k, and 324o, respectively. While the replaced interior boundary-scan cells were intended to act as a test interface only to an output signal of a logic block, the modified boundary scan cells are intended to do double duty, each being connected between a respective logic block input and logic block output, by providing input stimulus to its respective logic block input and providing observability for its respective logic block output.

The IEEE 1149.1 TAP specification requires boundary scan cells with specific capabilities. In order to provide compatibility with the TAP specification, it is necessary to provide fully compliant boundary scan cells at the boundary of the ASIC (i.e., at signals connected to pins of the ASIC), but for interior scan chains, it is possible to provide subset functionality for the boundary-scan cells. FIGS. 4b–4e are schematic diagrams of circuits suitable for use as peripheral scan cells in interior scan chains of the present inventive technique.

Figure 4B:
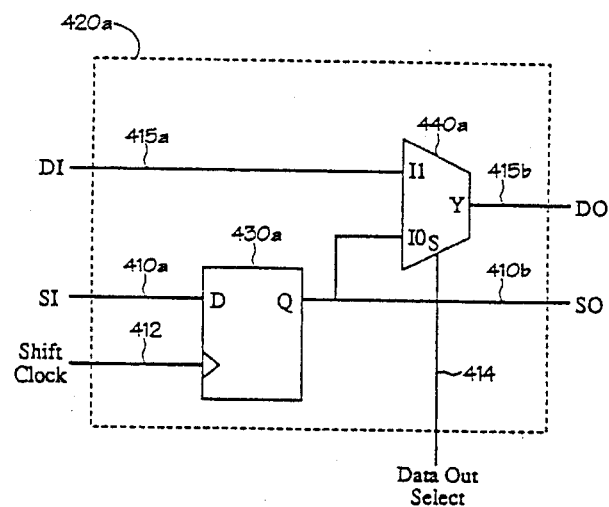
FIGS. 4b–4e are logic diagrams of circuits suitable for implementation of the peripheral scan cell of FIG. 4a, according to the invention.

FIG. 4b is a schematic diagram of a simple boundary scan cell 420a which may be used to isolate an input pin of a logic block. A data-in (DI) signal 415a connects to one input of a two-input multiplexer 440a. A flip-flop 430a is provided as part of a serial shift register chain. The D input of the flip-flop 430a is connected to a serial data input (SI) 410a originating at a serial data output of another (previous) boundary-scan cell. The Q output of the flip-flop 430a provides a serial data output (SO) signal 410b, and also connects to the second input of the two-input multiplexer 440a. A data out select signal (generated by an external TAP controller) on line 414 controls whether a data out signal (DO) 415b, connected to the input of the logic block, is taken from the data-in (DI) signal 415a (normal operation) or from the Q of the flip-flop 430a (test mode). A shift clock 412 (connected in common to all boundary-scan cell shift clock inputs) clocks serial data on the serial data in line 412 into the flip-flop 430a.

Figure 4C:
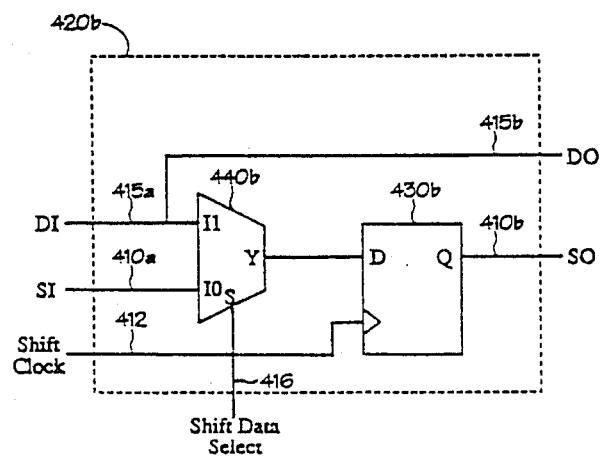

FIG. 4c is a schematic diagram of another simple boundary-scan cell 430b, suited to isolating an output signal of a logic block. The data-in signal 415a, connected to the output signal of the logic block, connects to a first input of a two input multiplexer 440b, and directly to the DO signal 415b. The other input of the two-input multiplexer 440b is connected to the shift data input signal (SI) 410a. A shift data select signal 416 connects to a select input of the two-input multiplexer, and determines whether the first input or the second input of the multiplexer 440b is presented at the output (Y) of the multiplexer. The multiplexer output connects to the D input of the flip-flop 430b. The q output of the flip-flop 430b connects to the serial data output 410b (SO).

The shift clock signal 412 causes the contents of the flip-flop to be updated.

When the shift data selector 416 selects the serial data input (SI) 410a, the flip-flop becomes part of a boundary-scan shift register, and each clock cycle of the shift clock 412 advances the data in the boundary-scan shift register one position forward. When the shift data selector 416 selects the data input signal 415a (from the output signal of the logic block) the next cycle of the shift clock signal 412 causes the output signal to be sampled and stored in the flip-flop.

Figure 4D:
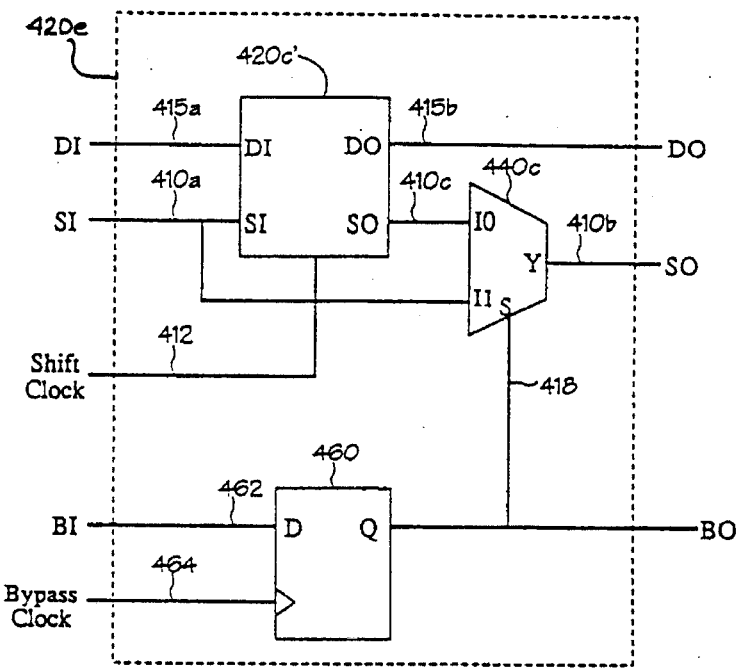

FIG. 4d is a schematic diagram of a third boundary-scan cell 420e built around a simpler boundary-scan cell 420c' of the type shown and described with respect to either FIG. 4b or 4c. In this case a second flip-flop 460 which is part of a bypass shift register chain and a bypass multiplexer 440c are added to the boundary-scan cell. The purpose of the "bypass" components 440c and 460 is to provide a means for programming the boundary-scan cell 420e so that it is eliminated from the boundary-scan shift register chain. In this case, a bypass data input (BI) 462 connects to the D input of the bypass flip-flop 460. The Q output of the bypass flip-flop 460 provides the bypass data output (BO) 418 to the next boundary-scan register of this type in the bypass chain, and provides the select input to the bypass multiplexer 440c. A bypass clock signal (from the TAP controller) moves the bypass data through the bypass shift register chain. The shift data output (SO) 410b of the boundary-scan cell 420e is connected to the output of the bypass multiplexer 440c. One input of the bypass multiplexer is connected to the shift data output signal (SO) 410c of the embedded boundary-scan cell 420c', while the other input of the bypass multiplexer 440c is connected to the shift data input 410a of the boundary-scan cell 420e. The shift data input, data-input, and data output signals 410a, 415a and 415b, respectively, are connected directly to the embedded boundary-scan cell 420c'.

When the bypass flip-flop 460 has a logic '1' at its Q output, the bypass multiplexer logically connects the shift data output 410b to the shift data input 410a, effectively eliminating the boundary-scan cell 420e from the boundary-scan shift register chain. When the bypass flip-flop 460 has a logic '0' at its Q output, the shift data output 410b is taken from the shift-data output 410c of the embedded boundary-scan cell 420c', placing the boundary-scan cell 420e in the boundary-scan shift-register chain.

Figure 4E:
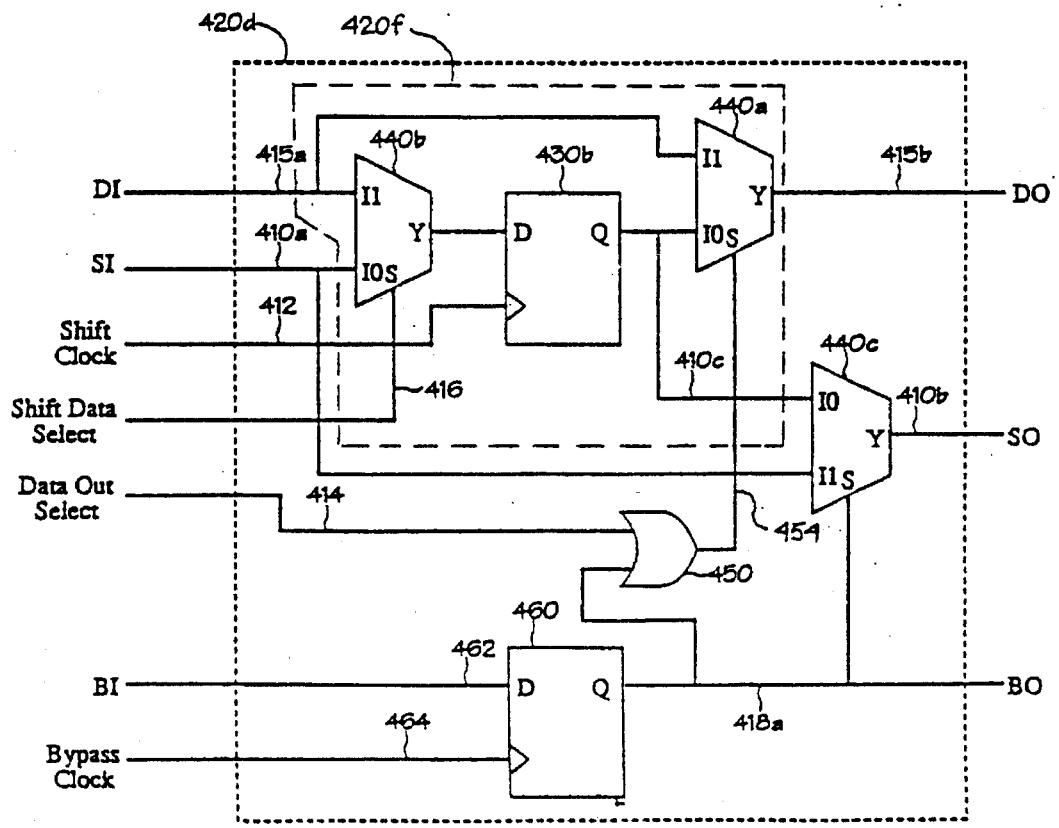

FIG. 4e is a schematic diagram of a fourth peripheral-scan cell 420d incorporating all of the features of the boundary scan cells 420a, 420b, and 420e, described and shown with respect to FIGS. 4b, 4c, and 4d, respectively, where similarly named and numbered circuit elements perform similar functions. Cell 420f incorporates all of the features of cells 420a and 420b. This peripheral-scan cell or register 420d provides for data-out selection via multiplexer 440a, shift-data selection via multiplexer 440b, and bypassed operation via bypass multiplexer 440c and bypass shift register 460. Additionally, however, the data-out select signal 414 and the bypass select signal 418a are logically combined by an "OR" gate 450 outputting an overridden Data-Out Select signal on line 454, to force the data path to be bypassed (i.e., data out connected to data in) when the boundary-scan cell is bypassed. This type of peripheral scan cell is capable of the "double duty" mode of operation described with respect to FIG. 3c (see, for example, 324e').

It should be noted that for any of the circuits shown above, transitions would be seen on the data out signals (DO) while test data is shifted in/out. If desirable, an additional buffer flip-flop may be inserted between input signals of the logic blocks and the DO signal of the boundary-scan cell. This buffer flip-flop would be strobed after all of the data had been shifted, eliminating the spurious data transitions at the inputs to the logic blocks.

Unless boundary-scan cells are serving "double duty" as described hereinabove with respect to FIG. 3c, it is possible to separate serially connected chains of boundary-scan cells connected to input signals from serially connected chains of boundary-scan cells connected to output signals. Since the input values are of no interest in analyzing the outputs of a logic block, and the output values are of no interest in applying test data values, these chains may be separated, potentially shortening the number of shift clocks required to gain access to a particular input or output signal.

When pre-defined test vectors are available for a standard cell, it is possible to use those test vectors with the interior boundary-scan technique of the present invention. Each input and output signal of the standard cells in an ASIC has a bit position in a boundary-scan "word" (assuming that interior boundary-scan cells have been provided for each standard cell and/or logic block). This boundary-scan word is made up of the collection of test data bits in the boundary-scan cells in the order that they are shifted in (and out). The bit values in the test vectors are each assigned to a corresponding bit position in the boundary-scan "word", and are shifted into the ASIC via the test pins on the ASIC. The standard cell(s) is(are) then operated for the amount of time or the number of clock cycles specified by the test vectors. Next, the output signals of the standard cell(s) is(are) sampled into the respective boundary-scan cells and are shifted out of the ASIC via the TDO pin and analyzed externally. Just as each input signal had a respective bit position in the boundary-scan "word" data shifted into the ASIC, each output signal has a respective bit position is the boundary-scan "word" shifted out of the ASIC. Because of this fixed assignment of test vector signal values to bit positions in the boundary-scan "word", the process of translating test vectors lends itself readily to automation. This applies whether there is one boundary scan chain or more than one. The only difference is the specific boundary-scan "word" to be used, and the specific bit position of any given signal within that word.

This approach lends itself to a method of translating test vectors to the interior boundary-scan technique of the present invention according to the following steps:

Given a set of test vectors (including stimulus vectors and response vectors) for a given standard cell which has been equipped with boundary-scan cells at all input and output signals thereof:

1) For each input signal in the stimulus test vectors, determine a corresponding boundary-scan "word" and bit position.

2) Generate input boundary-scan "word" data for each stimulus test vector input value, according to the bit assignments determined in (1), associating any stimulus duration value or number of clocks with the input boundary-scan "word" data.

3) For each output (response) signal in the response vectors, determine a corresponding boundary-scan "word" and bit position.

4) Generate expected output boundary-scan "word" response data according to the bit assignments determined in (3).

The actual test methodology is as follows, assuming one or more logic blocks for which an interior boundary-scan capability has been provided:

1) Place TAP in a mode which permits test data to be shifted into the boundary-scan cells.

2) Shift in a boundary-scan input "word" (corresponding to a stimulus vector)

3) Place the TAP in a mode which permits operation of the standard cell(s) with the boundary-scan test data.

4) Operate the standard cell(s) according to a duration or number of cycles associated with the boundary-scan input "word".

5) Place the TAP in a mode which permits output signal values to be sampled into respective boundary-scan cells.

6) Sample the output signal values of the standard cell(s) into the respective boundary-scan cells.

7) Place the TAP in a mode which permits boundary-scan cell data to be shifted out of the boundary-scan chain.

8) Shift out a boundary-scan output "word".

9) Compare the boundary-scan output "word" with the expected boundary-scan output "word" value.

While the discussion hereinabove has focused primarily on a single interior/exterior boundary-scan chain, or an external boundary-scan chain with a supplemental interior boundary-scan chain, it should be recognized that it is within the scope of the present invention that the boundary-scan chains may be further broken up without loss of generality. Further, any technique which may be used in conjunction with exterior boundary-scan techniques (e.g. IEEE 1149.1), such as boundary-scan chain multiplexing, may be used in conjunction with interior boundary-scan.

What is claimed is:

1. A double-duty input-output peripheral-scan cell comprising:

a data line pair including a data input line and a data output line;

a serial line pair including a serial input line and a serial output line;

output terminal isolation multiplexer means having two output multiplexer inputs connected to respective ones of said data input line and said serial input line, an output multiplexer output sample signal line, and a select signal input terminal, and responsive to a Shift Data Select signal received at said select signal input terminal to select either of said output multiplexer inputs and connect it to said sample signal line;

data signal storage means for receiving a signal on said sample signal line, sampling and storing it, and outputting a stored signal value on said serial output line;

input terminal isolation multiplexer means having two input multiplexer inputs, one connected to said serial output line and the other connected to said data input line, an input multiplexer output signal line connected to said data output line, and a select signal input terminal, and responsive to a Data Out Select signal received at said select signal input terminal to select either of said input multiplexer inputs and connect it to said data output line; and bypass means including bypass flip-flop means having a bypass input line for receiving a bypass input signal, and an output line for holding a bypass output signal; and bypass multiplexer means having one bypass multiplexer input connected to said serial output line, and another bypass multiplexer input connected to said serial input line, and responsive to the bypass output signal to select either bypass multiplexer input signal to output as a new serial output signal.

2. A cell as in claim 1 wherein said bypass means further comprises:

an OR gate having an output line providing the Data Out Select signal to said input terminal isolation multiplexer means, a first input line connected to receive said Data Out Select signal, and a second input line connected to receive said bypass output signal.

3. In a testable core-cell based integrated circuit of the type having:

a single integrated circuit die having an interior and an exterior;

a plurality of pins constituting electrical connections between the interior and the exterior of said die, including logic block I/O pins, a TMS pin and a TCK pin, and at least one serial-set having a TDI pin and a TDO pin;

a TAP controller on said die having inputs connected to said TMS pin and to said TCK pin, and outputs providing clock signals and select signals;

at least two logic blocks on said die each having an inside and an outside and a plurality of signal terminals constituting electrical connections between the inside and the outside of that block;

a plurality of boundary-scan cells each having
a data line pair including a data input line and a data output line, one of said lines connected to one of said terminals, and the other of said lines connected to one of said logic block I/O pins,
a serial line pair including a serial input line and a serial output line,
transmission means for connecting either the data input line to the data output line or the serial input line to the serial output line, and
multiplexer means for coupling the input line either of said data line pair or of said serial line pair to whichever of said data output line and said serial output line is not connected by said transmission means;

each said at least one serial-set having a respective chain of connections from said TDI pin to the serial input line of a first of a series of scan cells each having its serial output line connected to the serial input line of a succeeding scan cell up to a last scan cell having its serial output line connected to said TDO pin; the improvement therewith comprising:

a plurality of peripheral-scan cells each having:
a data line pair including a data input line and a data output line,
a serial line pair including a serial input line and a serial output line, both coupled, outside said peripheral-scan cell, to respective ones of said terminals;
output terminal isolation multiplexer means having two output multiplexer inputs connected to respective ones of said data input line and said serial input line of said peripheral-scan cell, an output multiplexer output sample signal line, and a select signal input terminal, and responsive to a Shift Data Select signal received at said select signal input terminal to select either of said output multiplexer inputs and connect it to said sample signal line;
data signal storage means for receiving a signal on said sample signal line sampling and storing it, and outputting a stored signal value on said serial output line; and
input terminal isolation multiplexer means having two input multiplexer inputs one connected to said serial output line and the other connected to said data input line, an input multiplexer output signal line connected to said data output line, and a select signal input terminal, and responsive to a Data Out Select signal received at said select signal input terminal to select either of said input multiplexer inputs and connect it to said data output line; and bypass means including
- bypass flip-flop means having a bypass input line for receiving a bypass input signal, and an output line for holding a bypass output signal; and
- bypass multiplexer means having one bypass multiplexer input connected to said serial output line, and another bypass multiplexer input connected to said serial input line, and responsive to the bypass output signal to select either bypass multiplexer input signal to output as a new serial output signal.

4. A circuit as in claim 3 wherein said bypass means further comprises:

an OR gate having an output line providing the Data Out Select signal to said input terminal isolation multiplexer means, a first input line connected to receive said Data Out Select signal, and a second input line connected to receive said bypass output signal.

* * * * *